United States Patent
Shapiro et al.

(10) Patent No.: US 7,132,894 B2
(45) Date of Patent: Nov. 7, 2006

(54) DIFFERENTIAL TRAVELING WAVE DRIVER AMPLIFIER

(75) Inventors: Eric S. Shapiro, Woodland Hills, CA (US); Jose Robins, Poway, CA (US); Kevin W. Glass, Scottsdale, AZ (US); Kursad Kiziloglu, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 315 days.

(21) Appl. No.: 10/748,500

(22) Filed: Dec. 30, 2003

(65) Prior Publication Data

US 2005/0140453 A1 Jun. 30, 2005

(51) Int. Cl.
*H03F 3/08* (2006.01)
(52) U.S. Cl. .................. 330/308; 330/260; 330/286; 330/54
(58) Field of Classification Search ............... 330/308, 330/260, 286, 54
See application file for complete search history.

(56) References Cited

U.S. PATENT DOCUMENTS

| 5,196,805 A | * | 3/1993 | Beckwith et al. ............. 330/54 |
| 5,550,513 A | * | 8/1996 | Wong ......................... 330/286 |
| 6,094,099 A | * | 7/2000 | Kobayashi ................... 330/254 |
| 6,130,423 A | * | 10/2000 | Brehmer et al. ......... 250/208.1 |
| 6,667,659 B1 | * | 12/2003 | Stengel et al. .............. 330/286 |
| 6,768,378 B1 | * | 7/2004 | Stengel et al. ................ 330/54 |

FOREIGN PATENT DOCUMENTS

JP      2004072638 A   *  8/2002

OTHER PUBLICATIONS

A 3-V fully differential distributed limiting driver for 40-Gb/s optical transmission systems. McPherson, D.S.; Pera, F.; Tazlauanu, M.; and Voinigescu, S.P. IEEE Journal of Solid-State Circuits, vol. 38, No. 9, Sep. 2003.
A 3V Fully Differential Distributed Limiting Driver for 40Gb/s Optical Transmission Systems. D.S. McPherson, F.Pera, M. Tazlauanu and S.P. Voinigescu, IEEE GaAs IC Symp., Technical Digest, pp. 95-98, Oct. 2002.

* cited by examiner

*Primary Examiner*—Patricia Nguyen
(74) *Attorney, Agent, or Firm*—Trop, Pruner & Hu, P.C.

(57) ABSTRACT

In one embodiment, the present invention includes a differential traveling wave amplifier having a lumped differential preamplifier stage and a distributed differential amplifier stage coupled by a differential end termination interface. In certain embodiments, the distributed differential amplifier stage may include transverse electromagnetic transmission lines coupled between its input and output.

23 Claims, 6 Drawing Sheets

DIFFERENTIAL TRAVELING WAVE DRIVER AMPLIFIER

BACKGROUND

This invention relates generally to amplifying a high-frequency traveling wave.

As the operating frequencies of communication systems continue to increase, circuit designers face the challenge of creating circuits that are capable of handling these increased frequencies while maintaining the fidelity of traveling waves within the systems. Circuits operating at frequencies of 10 gigahertz ("GHz") or less are generally designed using a lumped circuit design approach without encountering a significant sacrifice of bandwidth, noise performance, or stability. At such frequencies, the dimensions of an integrated circuit are typically small compared to the shortest wavelengths of the electrical signals amplified by the circuit. However, the input and output impedances of a circuit operating at a bit rate of 40 gigabits-per-second ("Gb/s"), for example, are less likely to be adequately matched using a lumped circuit design approach. The assumptions inherent in the lumped circuit design approach are generally insufficient to capture all of the parasitic effects that are likely to be realized at bit rates beyond approximately 10 Gb/s.

Numerous single-ended traveling wave and lumped circuit solutions have been proposed to take into account the parasitic effects typically associated with high frequency circuits. However, traveling wave amplifiers are usually inefficient and may consume a large amount of power. More specifically, single-ended traveling wave solutions are generally input signal level dependent and are often subject to power supply noise variations.

Lumped circuit solutions typically necessitate large devices to achieve high output power, current, and/or voltage. Large devices are inherently more difficult to incorporate into a higher frequency design, as compared to a design that operates at a frequency of 10 GHz or less. Moreover, the large devices generally consume a large amount of power.

Thus, there is a need for an improved way of amplifying a high-frequency traveling wave.

DETAILED DESCRIPTION

Figure 1A:
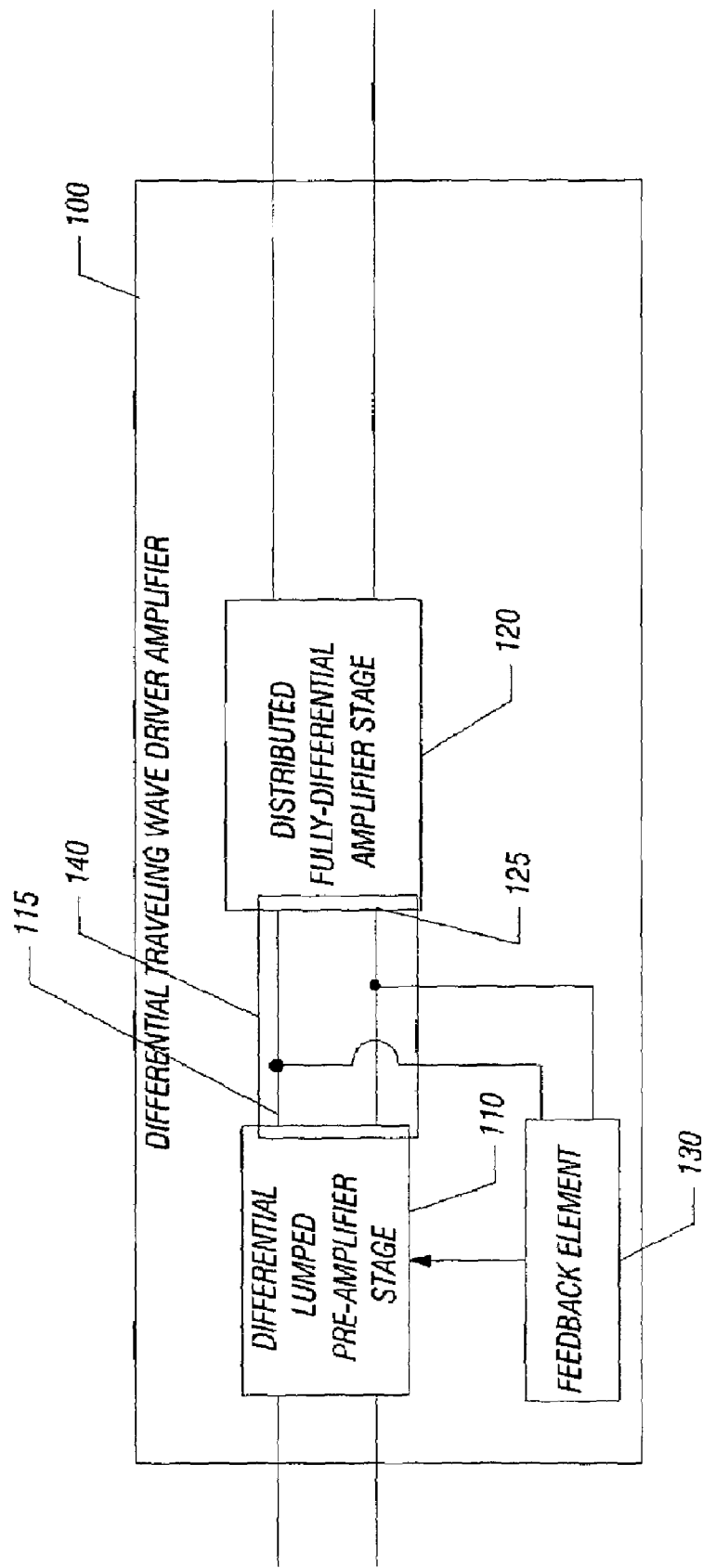
FIG. 1A is a block diagram of a differential traveling wave driver amplifier according to an embodiment of the present invention.

Referring to FIG. 1A, a differential traveling wave driver amplifier ("DTWA") 100 may amplify low-level electrical data. For example, a low-level signal may be amplified to a power level sufficient to drive another device or another portion of the circuit that includes the DTWA 100. For instance, the DTWA 100 may be capable of providing 20 decibels (dB) of single-ended gain in some embodiments. According to some embodiments, the DTWA 100 may be capable of operating at a frequency of at least approximately 40 GHz. Frequencies of this magnitude may be achieved with a variety of materials. The DTWA 100 may have an indium phosphide ("InP") substrate or a gallium arsenide ("GaAs") substrate, to provide some examples. According to some embodiments, the DTWA 100 may be capable of using a negative supply voltage. In some embodiments, the DTWA 100 may be capable of using a positive supply voltage to increase the headroom of the DTWA 100, for example.

Still referring to FIG. 1A, DTWA 100 may include a differential lumped pre-amplifier stage ("pre-amplifier stage") 110 and a distributed differential amplifier stage ("amplifier stage") 120. According to some embodiments, the pre-amplifier stage 110 and the amplifier stage 120 may be formed on the same substrate. Alternately, the pre-amplifier stage 110 and the amplifier stage 120 may be formed on different substrates, though the substrates may be the same type of material in an embodiment. For example, the pre-amplifier stage 110 and the amplifier stage 120 may be formed on separate InP or GaAs substrates. Further, the DTWA 100 may be formed from discrete components in certain embodiments.

According to some embodiments, the pre-amplifier stage 110 may limit the amplitude of a signal that is to be provided to the amplifier stage 120. For example, the pre-amplifier stage 110 may include switching circuitry to maintain the amplitude of the signal to be provided to the amplifier stage 120 within a predetermined range. Utilizing the pre-amplifier stage 110 rather than the amplifier stage 120 to limit the amplitude of the signal may reduce power consumption of the DTWA 100 in some embodiments, as the pre-amplifier stage 110 may consume less power than the amplifier stage 120.

In some embodiments, the pre-amplifier stage 110 may have multiple stages. Such multiple stages may provide a higher gain than a single stage. According to some embodiments, the pre-amplifier stage 110 may include distributed elements. For instance, distributed elements may allow a higher output voltage swing in some embodiments, as compared to lumped elements. Such distributed elements may include microwave elements that are modeled to include time delays, i.e., the travel time of signals between components cannot be neglected.

According to some embodiments, a feedback element 130 may manipulate the signal that is to be provided to the amplifier stage 120. For example, the feedback element may change or modify the duty cycle, phase, or amplitude of the signal, to provide some examples. The feedback element 130 may be a duty cycle adjuster ("DCA") servo loop, in some embodiments. In one embodiment, the pre-amplifier stage 110 may include the feedback element 130. In another embodiment, the feedback element 130 or a portion thereof may be external to the pre-amplifier stage 110, as shown in FIG. 1A. According to some embodiments, the feedback element 130 or a portion thereof may be external to the DTWA 100.

In some embodiments, the feedback element 130 may include a variable resistor. For example, the variable resistor may be adjusted manually or using software. In some embodiments, adjusting the resistor may increase the probability that the duty cycle, phase, or amplitude of the signal to be provided to the amplifier stage 120 is within a predetermined range. According to some embodiments, the feedback element 130 may enable the DTWA 100 to be less affected by variations in input level, temperature, power supply voltages or currents, or the process used to fabricate the DTWA 100.

The pre-amplifier stage 110 may have a differential output 115. The amplifier stage 120 may have a differential input 125 coupled to the differential output 115 of the pre-amplifier stage 110 to provide a differential interface 140 between the pre-amplifier stage 110 and the amplifier stage 120.

In various embodiments, certain advantages may be obtained by using a differential architecture. For example, by using differential signaling in high speed input/output (I/O) circuits there is no radio frequency (RF) return currents through the power lines since current drawn from a power supply is constant. This leads to better performance in the presence of power supply noise and lower cost, as power supply inductance and other factors are not as critical as with single-ended circuits. In addition, there may be less need to provide large decoupling capacitors and other circuitry, saving die area.

Figure 1B:
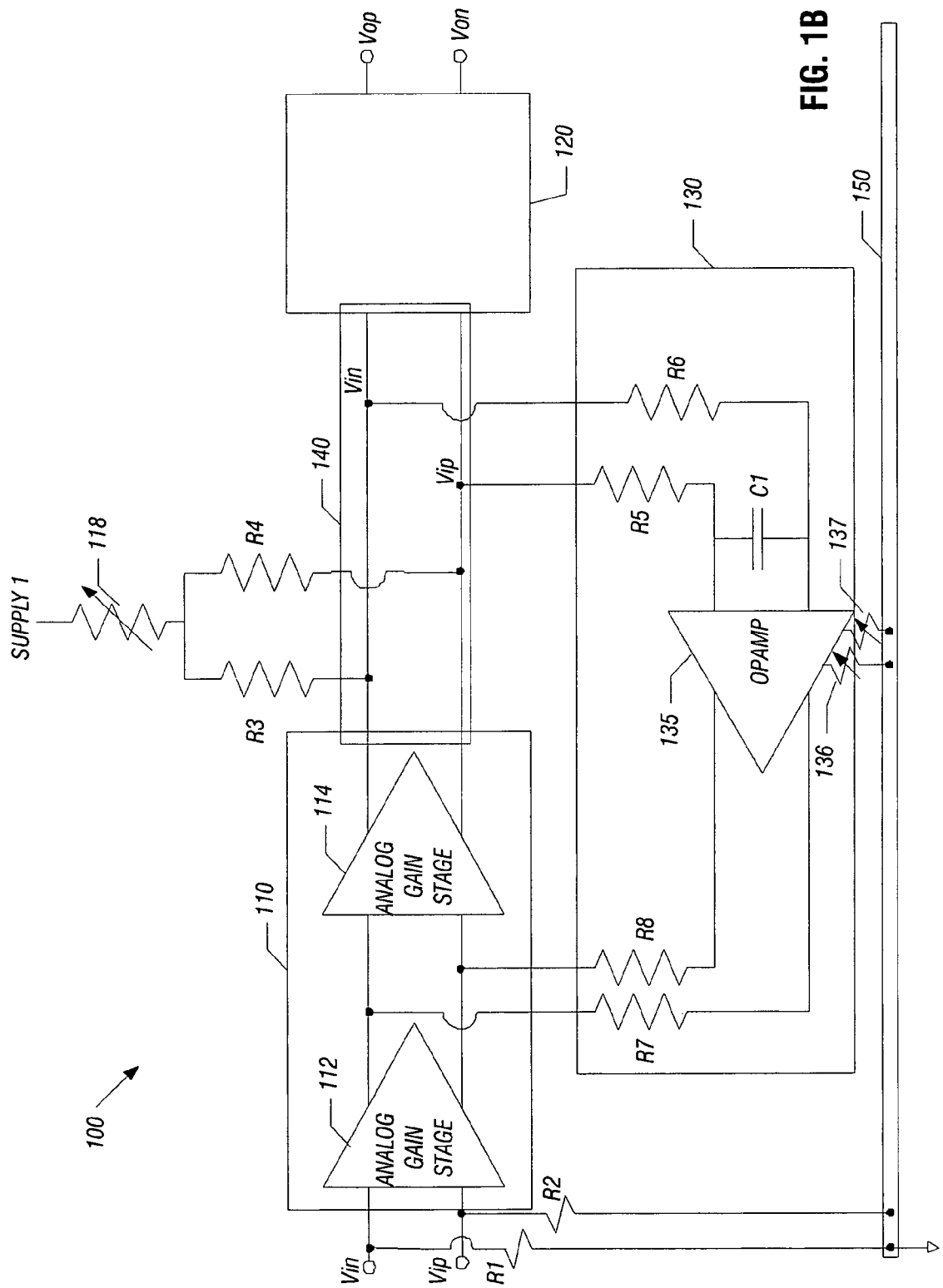
FIG. 1B is a detailed block diagram of the differential traveling wave driver amplifier of FIG. 1A.

Referring now to FIG. 1B, a more detailed block diagram of the DTWA 100 is shown in accordance with an embodiment of the present invention. As shown in FIG. 1B, the pre-amplifier stage 110 may receive differential inputs $V_{in}$ and $V_{ip}$, which each may be terminated to a ground potential 150 through 50 Ohm (Ω) resistors (R1 and R2 in FIG. 1B), for example. The pre-amplifier stage 110 may include a first analog gain stage 112 and a second analog gain stage 114. The output of the second analog gain stage 114 may be provided to the amplifier stage 120.

According to some embodiments, the differential interface 140 may facilitate adjustment of the alternating current ("AC") voltage and/or direct current ("DC") voltage provided to the amplifier stage 120. Adjusting the AC or DC voltage may improve the output voltage swing of the DTWA 100 in some embodiments or provide a more optimum DC-AC operating point for the amplifier stage 120. In certain embodiments, the output swing of the DTWA 100 may be adjusted via the output swing of amplifier stage 120.

For example, the DTWA 100 may be capable of providing an output voltage swing of at least 6 volts in some embodiments. The AC or DC voltage may be adjusted by manipulating the bias current of the analog gain stages 112 and 114 in some embodiments. The voltages may be adjusted by manipulating the resistance of a variable resistor 118 coupled through resistors R3 and R4 to the differential output of the pre-amplifier stage 110 according to some embodiments. As shown in FIG. 1B, differential interface 140 may include resistors R3 and R4 and variable resistor 118. For example, the variable resistor 118 may be used to set $V_{in-dc}$ and $V_{ip-dc}$ to the DC voltage level desired at the amplifier stage 120 inputs. In one embodiment, resistors R3 and R4 may be 50 Ω resistors. The variable resistor 118 may be coupled to a supply (Supply 1), which may be a DC voltage or a ground potential in some embodiments.

As further shown in FIG. 1B, the output of the pre-amplifier stage 110, namely the differential signal pair $V_{in}$ and $V_{ip}$, may be fed back to a feedback element 130, which may include an operational amplifier ("op-amp") 135, through resistors R5 and R6 which, in some embodiments, each may be a one kilohm (kΩ) resistor. In certain embodiments, a capacitor C1 may be coupled between the differential inputs of the op-amp 135 to reduce parasitic effects and aid in setting the bandwidth of the op-amp 135. In some embodiments, controlling the DC offset and/or the duty cycle of the op-amp 135 may be performed using variable resistors 136 and 137. The output of the op-amp 135 may be provided through resistors R7 and R8, which in some embodiments may be 1 kΩ resistors, to an input of the second analog gain stage 114.

Figure 2:
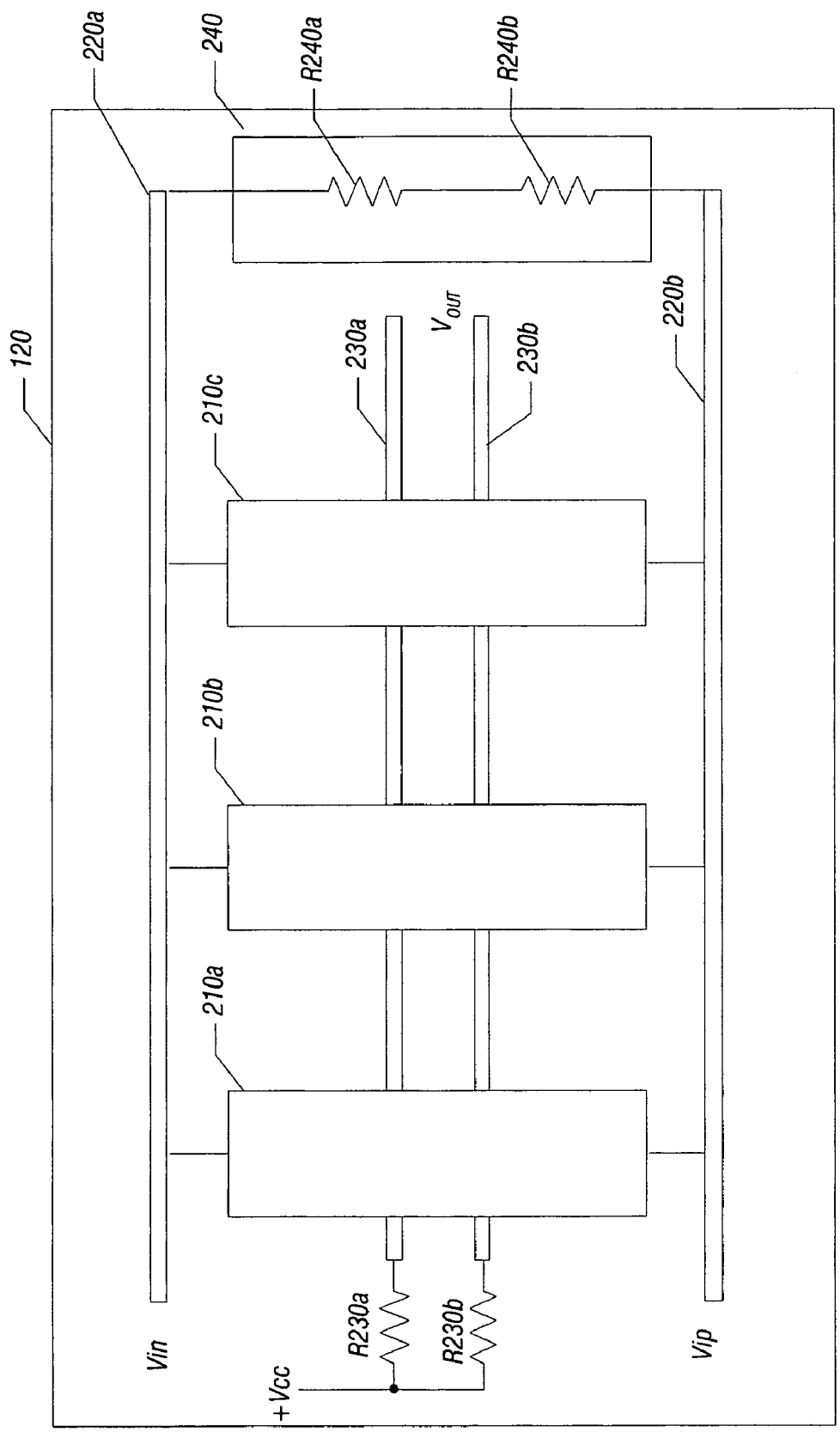
FIG. 2 is a block diagram of a distributed differential amplifier stage according to an embodiment of the present invention.

Referring now to FIG. 2, the amplifier stage 120 may include distributed differential gain blocks 210. In the embodiment shown in FIG. 2, first, second and third gain blocks 210a, 210b and 210c, respectively, may be present. While shown in the embodiment of FIG. 2 as including three such gain blocks, in other embodiments more or fewer gain blocks may be present, as desired. According to some embodiments, the distributed differential gain blocks 210 may enable the amplifier stage 120 to provide a larger output voltage swing than comparably sized lumped gain blocks. Increasing the output voltage swing of lumped gain blocks generally requires larger transistors. The distributed nature of the gain blocks 210 shown in FIG. 2 may enable the amplifier stage 120 to provide a larger output voltage swing without the need for larger transistors in some embodiments. For example, a larger transistor may have a higher output capacitance than a smaller transistor, which in some embodiments may negatively affect bandwidth. Thus, the distributed differential gain blocks 210 may enable a larger output voltage swing without sacrificing bandwidth, in some embodiments. That is, by coupling the power and/or signals of multiple gain blocks, smaller amplifiers may be combined to obtain a wide bandwidth output signal.

The distributed differential gain blocks 210 may be coupled to the input lines 220a and 220b and the output lines 230a and 230b. In some embodiments, the output lines 230 of the amplifier stage 120 may be electrically coupled. For example, the output lines 230a and 230b may be designed to account for their proximity to one another. In such manner, the output lines 230a and 230b may allow a particular transmission line ("T-line") characteristic impedance to be set, while allowing the lines to be spaced close enough together to enable a differential pair transistor network to connect to both of the output lines 230a and 230b in some embodiments.

As shown in FIG. 2, a pair of resistors R230a and R230b coupled to a supply voltage (e.g., $V_{CC}$) may be used to couple the output lines 230a and 230b together in some embodiments. While shown as being coupled to a positive supply voltage in FIG. 2, in other embodiments resistors R230a and R230b may be coupled to a ground potential or a negative supply voltage. The resistors R230a and R230b may provide a distributed load to the amplifier stage 120 in some embodiments. For example, resistors R230a and R230b may be 50Ω resistors. However, in other embodiments, different passive elements may be used to couple output lines 230a and 230b to each other.

In other embodiments, for example, where gain blocks 210 include their own supply voltages, a supply voltage need not be present to couple resistors R230a and R230b. In such embodiments, these resistors (or other desired passive or active devices) may act as an output differential end termination interface. In such manner, output lines 230a and 230b may be differentially coupled without a connection to either a supply voltage or a ground potential.

According to some embodiments, having the output lines 230 spaced in close proximity to one another may enable the distributed differential gain blocks 210 to couple to the output lines 230 with a smaller amount of common mode virtual ground inductance, as compared to having the output lines 230 spaced farther apart. For example, the common mode virtual ground inductance of the output lines 230 may be negligible in some embodiments if the output lines 230 are electrically coupled to be in close proximity to each other. In certain embodiments, the output lines 230 may be spaced between approximately 50 microns (μm) to 150 μm apart, and in certain embodiments, they may be spaced approximately 100 μm apart. In some embodiments, having coupled output lines 230 may improve the gain of the distributed differential gain blocks 210 by redirection of virtual ground inductance of the gain block due to the close proximity.

Similarly, in the embodiment of FIG. 2, the input lines 220a and 220b may be coupled via a differential end termination interface (DETI) 240. In certain embodiments, the DETI 240 may be configured such that it has no connection to either a power supply voltage or a ground potential. In such manner, the DETI 240 may act as an open circuit at DC. In some embodiments, the DETI 240 may consume less power than a single-ended end termination for each T-line in a single-ended configuration. According to some embodiments, the DETI 240 may consume a negligible amount of DC power for each T-line, and may consume negligible DC power in some embodiments, as it may act as an open circuit at DC. Thus, no DC drop may occur along the traveling wave input line, which may improve uniformity of gain block operation in the amplifier stage 120, in some embodiments. The DETI 240 may improve the bandwidth of the DTWA 100 in some embodiments. For example, the DETI 240 may reduce a need for capacitive (i.e. frequency-dependent) bypassing at the differential input 125 of the amplifier stage 120.

In the embodiment of FIG. 2, the DETI 240 may include a pair of 50Ω resistors, while in other embodiments, the DETI 240 may be a single 100Ω resistor. While disclosed in the embodiment of FIG. 2 as being resistors, it is to be understood that any passive elements may provide the differential end termination desired. More so while discussed in the embodiment of FIG. 2 as having particular values, it is to be understood that in different embodiments, different values of system impedance may be effective. Such values may be determined by one skilled in the art to provide desired system impedance and reduce parasitic effects. Further, in certain embodiments, some amount of tuning may be incorporated (at least to tune out parasitic effects) by use of certain devices, such as an inductor. In one such embodiment, an inductor may be coupled between resistors R240a and R240b. In yet other embodiments, active devices such as transistors or diodes may be used to provide desired bandwidth and such differential end termination.

Figure 3:
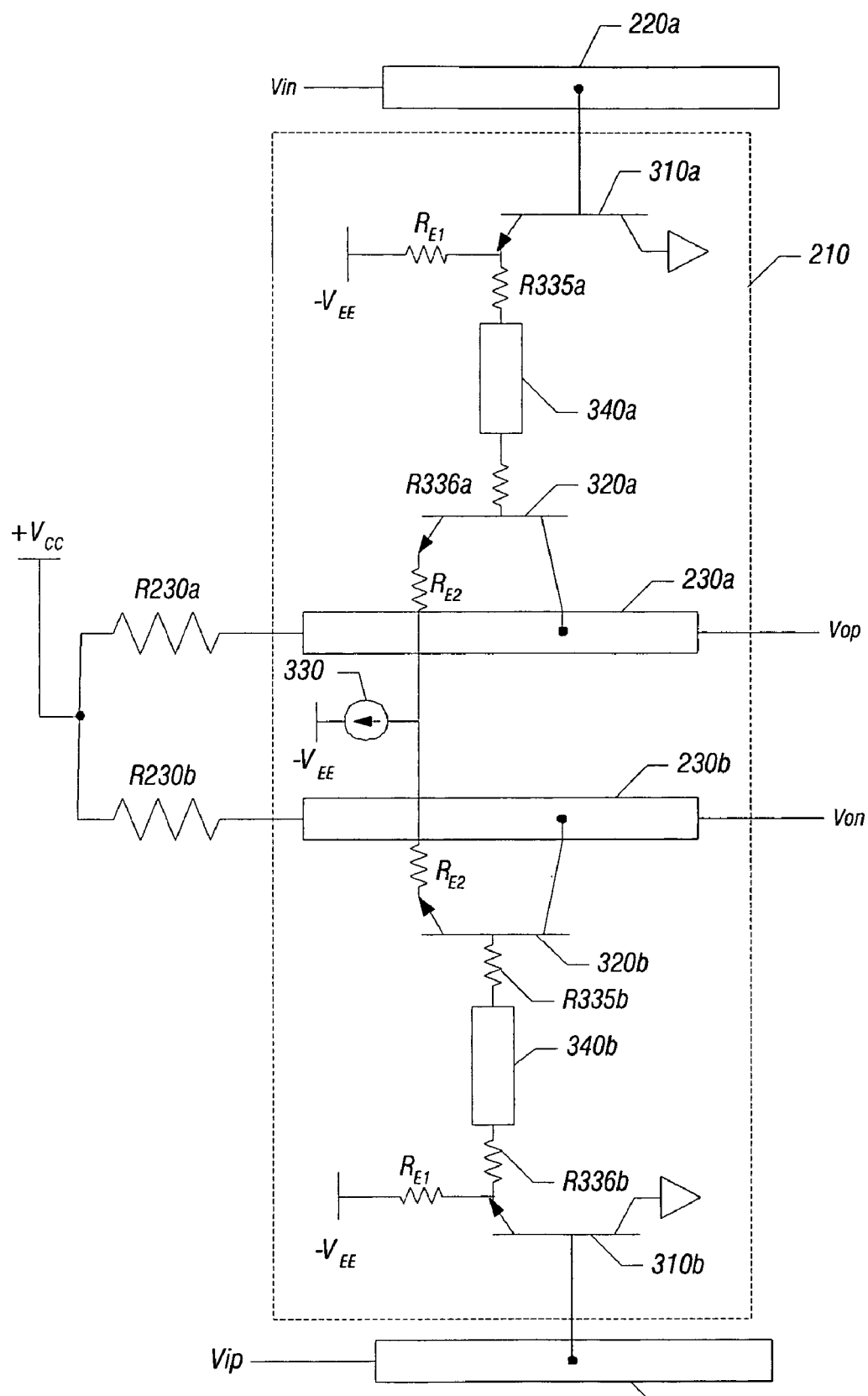
FIG. 3 is a schematic representation of a distributed differential gain block according to an embodiment of the present invention.

Referring to FIG. 3, a distributed differential gain block 210 may include any of a variety of transistor configurations to achieve an appropriate input and/or output loading capacitance to accommodate a particular bandwidth, in some embodiments. For example, the differential gain block 210 may include common-collector transistors (i.e., emitter-follower transistors) 310a and 310b, common-emitter transistors 320a and 320b, and a current source 330, which may be a DC current source, though any suitable configuration of transistors may be included. In certain embodiments, the transistors in the differential gain block 210 may be InP double heterojunction bipolar transistors (DHBT). As shown in FIG. 3, the current source 330 may be located between the output lines 230a and 230b in some embodiments.

According to some embodiments, the common-collector transistors 310a and 310b may be coupled to respective input lines 220a and 220b. As shown, transistors 310a and 310b may have bases coupled to respective input lines 220a and 220b, collectors coupled to ground, and emitters coupled to a $-V_{EE}$ voltage through a resistor RE1. In some embodiments, the common-emitter transistors 320a and 320b may be coupled to respective output lines 230a and 230b. As shown, transistors 320a and 320b may have collectors coupled to the output lines 230a and 230b, emitters coupled to the current source 330 through a resistor RE2, and bases coupled to bridging elements 340a and 340b. While described in the particular configuration shown in FIG. 3, in other embodiments other transistor configurations, such as cascoded transistors may be used.

According to some embodiments, the bridging element 340 may be coupled between the common-collector transistor 310 and the common-emitter transistor 320. For instance, the bridging element 340 may enable the input line 220 and the output line 230 to be spaced farther apart than input and output lines of a gain block that does not include the bridging element 340. The bridging elements 340a and 340b may enable the emitters of the common-emitter transistors 320a and 320b to be in closer proximity to each other in some embodiments. For example, having the emitters in closer proximity may increase the gain of the distributed differential gain block 210 in some embodiments. According to some embodiments, bridging element 340 may reduce inductance and/or improve input impedance of the amplifier stage 120, which may reduce loading of the pre-amplifier stage 110 in some embodiments. In certain embodiments, additional bridging elements may be included between input and output lines.

In various embodiments, a ground plane may be incorporated between input lines 220 and output lines 230. Because each gain block 210 is coupled to both input lines 220 and output lines 230, the gain blocks must physically bridge the two sections of the circuit. Thus in various embodiments, bridging element 340 may be designed to traverse the physical layout distance between input lines 220 and output lines 230. In certain embodiments, bridging elements 340 may be transverse electromagnetic transmission line segments, such as microstrip transmission line segments, e.g., microwave monolithic integrated circuits (MMIC) microstrips. In certain embodiments, the bridging element 340 may utilize a ground plane of a coplanar waveguide (CPW) of the traveling wave input to minimize discontinuities and provide for desired high frequency operation. While discussed as transmission lines, it is to be understood that in other embodiments, bridging elements 340 may be other bridging components, such as a lumped inductance, a shunt capacitance, capacitors and inductors, and other such devices.

In some embodiments, the distributed differential gain block 210 may include one or more damping elements to improve the stability of the distributed differential gain block 210. For example, a pair of resistors R335 and R336 may be coupled on either side of bridging element 340, in some embodiments. In certain embodiments, such resistors may be used as damping resistors to broadband tune bridging elements 340 and provide a measure of stability.

Figure 4:
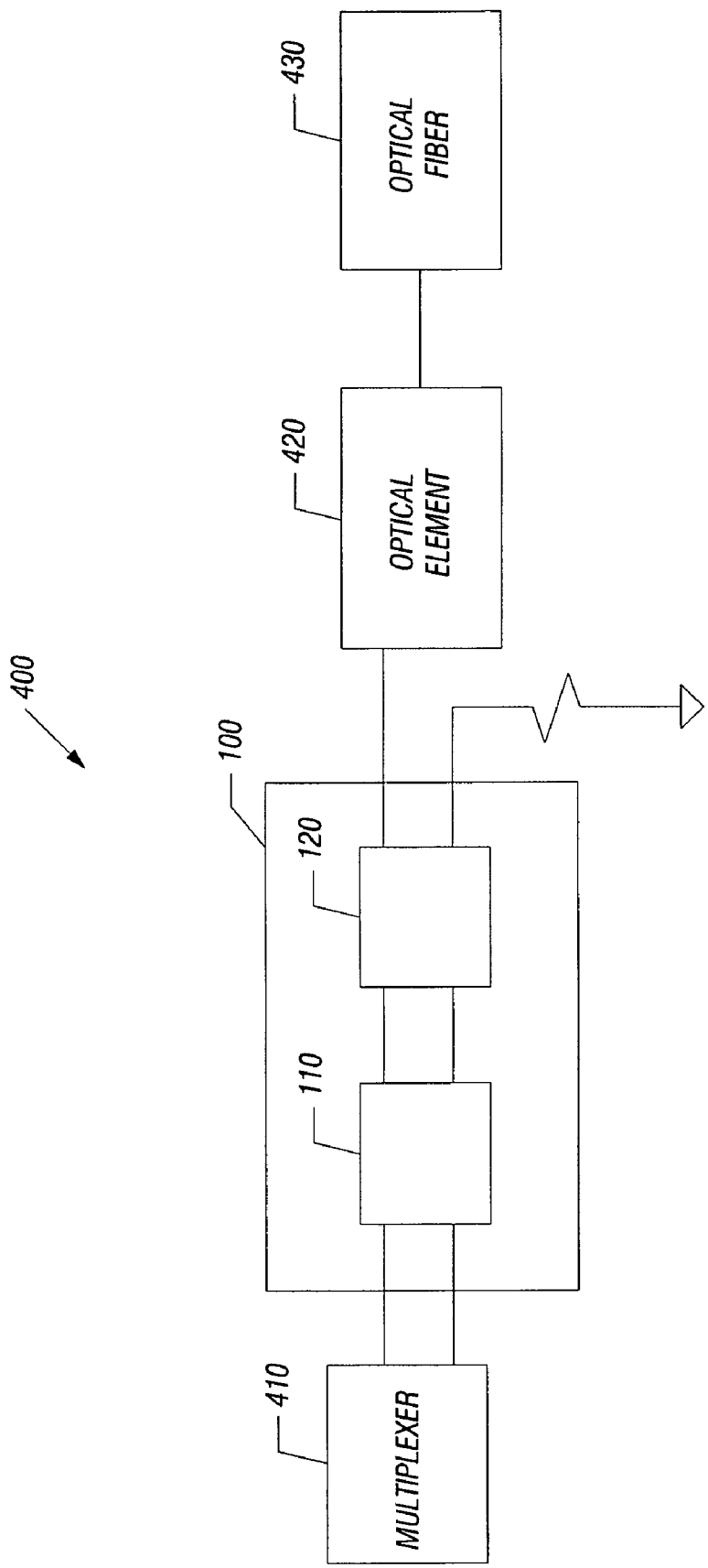
FIG. 4 is a block diagram of a system according to an embodiment of the present invention.

Referring to FIG. 4, a system 400 may be an optical transmission system, for example. The system 400 may be an optical communication chipset or module, telecommunication or automated test equipment, or a fiber optic receiver, to give some examples. The system 400 may include a DTWA 100. The DTWA 100 may be a surface mount device, a ceramic package, or an integrated circuit chip, to provide some examples. According to some embodiments, the DTWA 100 may be hermetically sealed to protect the DTWA 100 against moisture, for example. In some embodiments, the DTWA 100 may be radio frequency ("RF") shielded to protect the DTWA 100 against RF noise, for example.

The system 400 may further include a multiplexer 410 to provide a data signal to the DTWA 100. In some embodiments, the multiplexer 410 may provide a return-to-zero ("RTZ") signal and/or a non-return-to-zero ("NRZ") signal to the DTWA 100. For instance, the DTWA 100 may amplify the RTZ signal and/or the NRZ signal. According to some embodiments, the system 400 may include a limiting amplifier coupled between the multiplexer 410 and the DTWA 100 to amplify a signal received from the multiplexer 410. The limiting amplifier may provide the amplified signal to the DTWA 100, for example.

The system 400 may further include an optical element 420 to receive a signal from the DTWA 100. In some embodiments, the optical element 420 may be a laser driver. For example, the laser driver may provide a current to a light-emitting element in some embodiments. According to some embodiments, the optical element 420 may be an optical modulator to modulate the signal received from the DTWA 100. The optical modulator may be an electro-absorption ("EA") or lithium niobate ("LiNbO3") Mach Zehnder electro-optic modulator, to provide some examples.

The system 400 may further include an optical fiber 430 through which an optical signal may be transmitted. The optical element 420 may transmit the optical signal through the optical fiber 430 in some embodiments. According to some embodiments, a signal provided by the optical element 420 may be manipulated before being transmitted through the optical fiber 430. For example, the optical element 420 may provide a current signal to a laser, which may transmit the optical signal through the optical fiber 430 in some embodiments.

Figure 5:
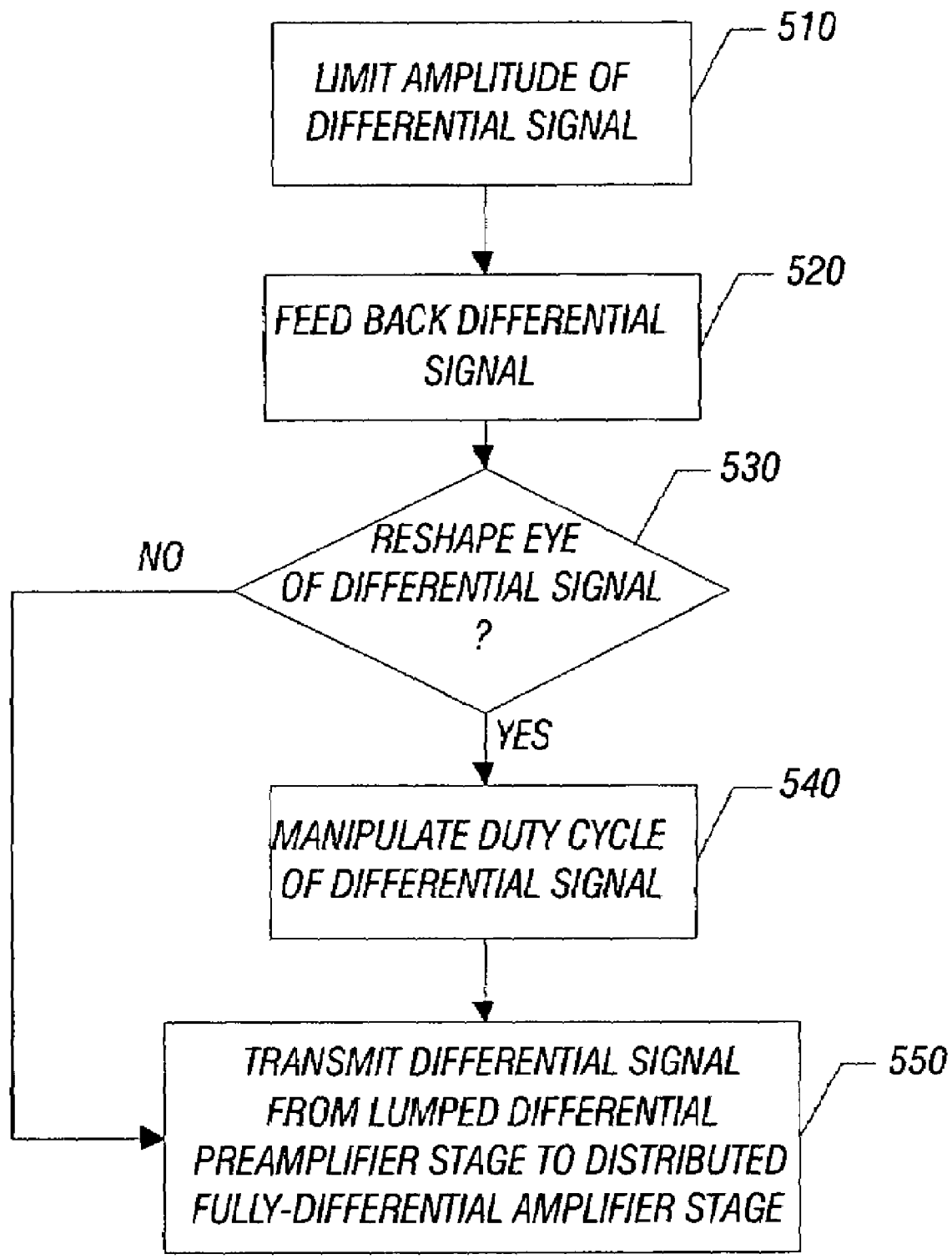
FIG. 5 is a flow chart of a method according to an embodiment of the present invention.

Referring to FIG. 5, a method is shown in accordance with an embodiment of the present invention. As shown in FIG. 5, the amplitude of a differential signal may be limited at block 510. In some embodiments, limiting the amplitude of the differential signal may improve the bandwidth of an amplifier, such as the DTWA 100 shown in FIG. 1A. For example, limiting the amplitude may enable an amplifier to accommodate a signal having a higher frequency. For instance, the differential signal may have a frequency of at least approximately 40 GHz in some embodiments.

The differential signal may be fed back to a pre-amplifier stage of the amplifier at block 520 to determine at diamond 530 whether the eye of the differential signal is to be reshaped. For example, a rising or falling edge of a portion of the differential signal may be shifted in time, as compared to a rising or falling edge of another portion of the differential signal. A determination to reshape the eye may be made if the shift in time exceeds a pre-determined amount, for example. If the eye is to be reshaped, then the duty cycle of the signal may be manipulated at block 540. Manipulating the duty cycle of the differential signal may shift the rising or falling edge of that portion of the differential signal in time.

The differential signal may be transmitted from the differential output of a lumped differential preamplifier stage to a differential input of a distributed differential amplifier stage, as indicated at block 550. Output transmission lines of the distributed differential amplifier stage may be coupled to reduce common mode virtual ground inductance in some embodiments.

According to some embodiments, the differential signal received from the distributed differential amplifier stage may be transmitted to a laser driver. In some embodiments, the differential signal received from the distributed differential amplifier stage may be modulated. A transverse electromagnetic transmission line segment may be utilized to bridge the gap between differential input and output lines of the differential traveling wave amplifier, in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a differential preamplifier stage including a differential output;
   a distributed differential amplifier stage including a differential end termination interface coupled to the differential output; and
   a feedback element to manipulate a signal to be provided to the distributed differential amplifier stage.

2. The apparatus of claim 1, further including a bridging element coupled between a differential input of the distributed differential amplifier stage and a differential output of the distributed differential amplifier stage.

3. The apparatus of claim 2, wherein the bridging element comprises a transverse electromagnetic transmission line segment.

4. The apparatus of claim 1, wherein the distributed differential amplifier stage comprises a first output transmission line and a second output transmission line and wherein the second output transmission line is differentially coupled to the first output transmission line.

5. The apparatus of claim 4, wherein the first output transmission line and the second output transmission line are coupled by at least one passive element.

6. The apparatus of claim 1, wherein the differential output comprises a first line and a second line and wherein the differential end termination interface comprises at least one passive element coupled between the first line and the second line of the differential output.

7. An apparatus comprising:
   a differential preamplifier stage coupled to a distributed differential amplifier stage, wherein the distributed differential amplifier stage includes a first output transmission line and a second output transmission line and wherein the first output transmission line is differentially coupled to the second output transmission line; and
   a current source coupled between the first and second output transmission lines.

8. The apparatus of claim 7, wherein the distributed differential amplifier stage includes a differential end termination interface.

9. The apparatus of claim 8, wherein the differential end termination interface is to couple a differential output of the differential preamplifier stage.

10. An apparatus comprising:
    a differential traveling wave amplifier including a differential input and a differential output, wherein the differential output includes first and second lines;
    a current source coupled between the first and second lines of the differential output; and
    at least one bridging element coupled between the differential input and the differential output.

11. The apparatus of claim 10, further comprising a first transistor coupled to a first line of the differential input and a second transistor coupled to the first line of the differential output.

12. The apparatus of claim 11, wherein at least one of the at least one bridging element is coupled between the first transistor and the second transistor.

13. The apparatus of claim 10, further comprising at least one damping element coupled to the at least one bridging element.

14. A system comprising:
a differential preamplifier stage including a differential output;
a distributed differential amplifier stage including a differential end termination interface coupled to the differential output, the differential end termination interface unconnected to a power supply or ground potential;
an optical modulator to modulate a signal received from the distributed differential amplifier stage; and
an optical fiber coupled to the optical modulator.

15. The system of claim 14, further comprising a feedback element to manipulate a signal to be provided to the distributed differential amplifier stage.

16. The system of claim 14, further including a bridging element coupled between an input and an output of the distributed differential amplifier stage.

17. The system of claim 16, wherein the bridging element comprises a transverse electromagnetic transmission line segment.

18. The system of claim 14, wherein the distributed differential amplifier stage includes first and second output transmission lines and wherein the first output transmission line of the distributed differential amplifier stage is differentially coupled to the second output transmission line of the distributed differential amplifier stage.

19. The system of claim 18, further comprising an output differential end termination interface coupled to the first and second output transmission lines.

20. A method comprising:
terminating a differential output of a differential preamplifier stage via a differential end termination interface of a distributed differential amplifier stage;
feeding back the differential output to manipulate the differential output; and
modulating an output signal of the distributed differential amplifier stage.

21. The method of claim 20, further including limiting an amplitude of the differential output.

22. The method of claim 20, further including bridging an input line and an output line of the distributed differential amplifier stage with a transverse electromagnetic transmission line segment.

23. The method of claim 20, further including differentially coupling a first output transmission line and a second output transmission line of the distributed differential amplifier stage.

* * * * *